United States Patent [19]

Moline et al.

[11] Patent Number: 5,309,019
[45] Date of Patent: May 3, 1994

[54] LOW INDUCTANCE LEAD FRAME FOR A SEMICONDUCTOR PACKAGE

[75] Inventors: Daniel D. Moline; Bernard E. Weir, III, both of Chandler, Ariz.

[73] Assignee: Motorola, Inc., Schaumburg, Ill.

[21] Appl. No.: 23,407

[22] Filed: Feb. 26, 1993

[51] Int. Cl.[5] ............... H01L 23/48; H01L 29/44; H01L 29/52; H01L 29/60

[52] U.S. Cl. .................. 257/670; 257/666; 257/676; 257/669; 257/674; 257/773; 257/776; 257/784

[58] Field of Search ............... 257/666, 670, 676, 669, 257/674, 773, 776, 784

[56] References Cited

U.S. PATENT DOCUMENTS

| | | | |
|---|---|---|---|
| 4,829,362 | 5/1989 | Tran et al. | 357/70 |
| 4,994,895 | 2/1991 | Matsuzaki et al. | 357/72 |

FOREIGN PATENT DOCUMENTS

| | | | |
|---|---|---|---|
| 3635375 | 4/1988 | Fed. Rep. of Germany | 357/81 |
| 1-171256 | 6/1989 | Japan | 357/81 |
| 2-202046 | 10/1990 | Japan | 357/81 |

*Primary Examiner*—Jerome Jackson
*Assistant Examiner*—T. M. Arroyo
*Attorney, Agent, or Firm*—Robert F. Hightower; Joe E. Barbee

[57] ABSTRACT

A low inductance lead frame (10) is formed to have a die attach area (11). A plurality of intermediate connection bars (12,13,14,15) are positioned to be parallel to sides of the die attach area (11), and to be in a plane that is displaced perpendicularly from the die attach area (11). Each end of each intermediate connection bar is separated from an end of each other intermediate connection bar. Supports (17) extend from the die attach area (11) to the intermediate connection bars (12,13,14,15) to provide support for the intermediate connection bars 12,13,14,15). A plurality of leads (19,33,34) are positional in a plane and have a proximal end near the intermediate connection bars (12,13,14,15).

12 Claims, 1 Drawing Sheet

LOW INDUCTANCE LEAD FRAME FOR A SEMICONDUCTOR PACKAGE

BACKGROUND OF THE INVENTION

The present invention relates, in general, to semiconductor packages, and more particularly, to a novel low inductance lead frame.

Previously, the semiconductor industry has utilized various configurations of lead frames to facilitate assembling packages for semiconductor devices. Often, custom lead frames are used in order to reduce inductance between a semiconductor device within a package and external circuits connected to the package's leads.

One problem with such custom lead frames is cost. Each custom lead frame typically is designed to accommodate one particular type of semiconductor device. Consequently, the cost of tooling and producing each lead frame is much greater than the cost of a standard lead frame. These high lead frame costs result in a high package cost. Additionally, special assembly tools often are required in order to adapt a standard production area to assembling the custom lead frame into a package. The special assembly tools, and special handling in the production area result in high assembly costs thereby further increasing the package's cost.

Accordingly, it is desirable to have a low inductance lead frame that can be utilized to produce a low inductance semiconductor package, that can be used for a variety of different types of semiconductor devices, that does not require special assembly tools, and that results in a low package cost.

SUMMARY OF THE INVENTION

Briefly stated, the present invention includes a lead frame having a die attach area. A plurality of intermediate connection bars are positioned to be parallel to sides of the die attach area, and to be in a plane that is displaced substantially perpendicularly from the die attach area. Each end of each intermediate connection bar is separated from an end of each other intermediate connection bar. Supports extend from the die attach area to the intermediate connection bars to provide support for the intermediate connection bars. A plurality of leads are positioned in a plane and have a proximal end near the intermediate connection bars.

A corresponding method is also included.

DETAILED DESCRIPTION OF THE DRAWINGS

Figure 1:
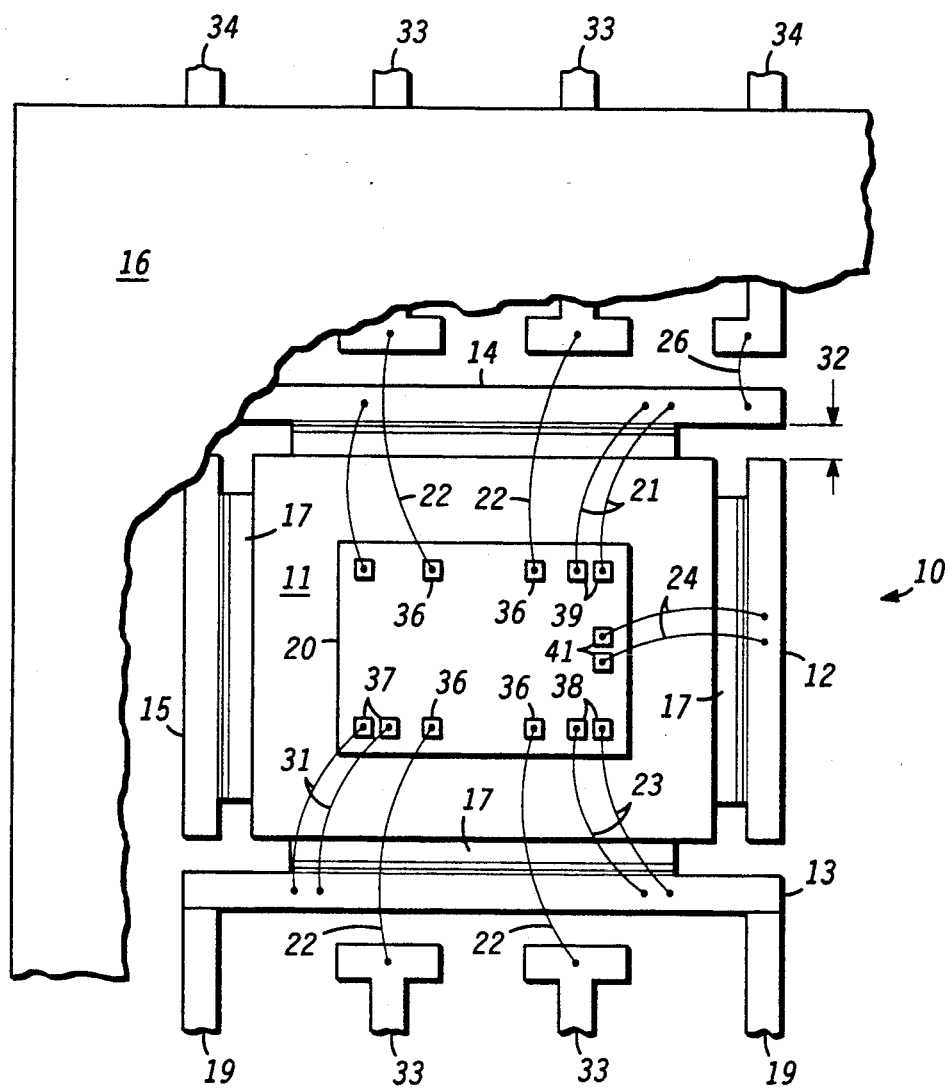
FIG. 1 illustrates a cut-away plan view of a portion of a semiconductor package in accordance with the present invention.

FIG. 1 illustrates, in cut-away, an enlarged plan view of a low inductance semiconductor package 9 having a low inductance lead frame 10. Lead frame 10 includes a first plurality of leads 19, a second plurality of leads 33, a third plurality of leads 34, a die attach area or flag 11, and a plurality of intermediate connection bars 12, 13, 14, and 15. Additionally a package body 16 encases flag 11, bars 12, 13, 14, and 15, and a portion of leads 19, 33, and 34. Flag 11 forms an area suitable for attaching a variety of different sized semiconductor die to lead frame 10. Thus, the shape and dimensions of flag 11 depend upon the size and shape of the semiconductor die to be attached thereon. A semiconductor die 20 illustrates one particular configuration that may be attached to flag 11. In the preferred embodiment, flag 11 has a rectangular shape that is between approximately three millimeters by two millimeters, and approximately four millimeters by three millimeters.

Intermediate connection bars 12, 13, 14, and 15 allow lead frame 10 to provide low inductance connections to die 20 and other semiconductor die of various sizes and layouts that may be attached to flag 11. Bars 12, 13, 14, and 15 are substantially parallel to the sides of flag 11, and are in a plane that is substantially parallel to and displaced perpendicularly from area 11. The width of bars 12, 13, 14, and 15 is at least sufficient to permit attaching a bonding wire. Also, each of bars 12, 13, 14, and 15 are separated from flag 11 by a distance that is determined by supports 17 as will be seen hereinafter. In the preferred embodiment, each of bars 12, 13, 14, and 15 are substantially planar, are approximately 0.2 to 0.5 millimeters wide, and are approximately 0.2 to 0.3 millimeters from flag 11.

Leads 19, 33, and 34 typically are all positioned in the same plane and are arranged in groups disposed near bars 12, 13, 14, and 15. In the preferred embodiment, leads 19, 33, and 34 are substantially coplanar to bars 12, 13, 14, and 15. Also in this preferred embodiment, leads 33, and 34 have proximal ends near bars 13 and 14, and are arranged in two groups, one disposed near bar 13 and one near bar 14.

A support means or plurality of supports 17 extend from flag 11 in order to support bars 12, 13, 14, and 15. Each support 17 is a solid element that extends from the plane of flag 11 at an angle relative to the plane of flag 11 as will be seen hereinafter. Each of supports 17 along any side of flag 11 could also be a plurality of smaller elements separated by spaces. In the preferred embodiment, each support 17 is a solid element substantially perpendicular to a side of flag 11, and extends away from the plane of flag 11 approximately at a forty-five degree angle toward the plane of bars 12, 13, 14, and 15.

Generally, the placement of bonding pads on a semiconductor die is determined by the position of the leads on the lead frame to which the die is to be attached. Often the bonding pads on small semiconductor die require long bonding wires to provide connection between the die and such lead frames. Intermediate connection bars 12, 13, 14, and 15 provide a place for forming intermediate connections between die 20 and leads 19, 33, and 34 thereby providing connection for a variety of different bonding pad configurations and die sizes. Each of a plurality of bonding pads 36 on die 20 are suitably arranged for connecting directly to leads 33 by a bonding wire 22. The location of a plurality of bonding pads 37, a plurality of bonding pads 38, a plurality of bonding pads 39, and a plurality of bonding pads 41 prevents forming connections directly to leads 19 and 34. Consequently, pads 37 and 38 are wire bonded to bar 13 by a plurality of bonding wires 31 and 23, respectively, pads 41 are wire bonded to bar 12 by a plurality of bonding wires 24, and pads 39 are wire bonded to bar 14 by a plurality of bonding wires 21.

Bars 13 and 14 can be connected to the leads by several different methods including forming one of the bars as a portion of the leads, as shown by leads 19 and bar 13. This typically is accomplished by stamping the leads and the bar from a single piece of material. Alternately, the connection can be formed by using bonding wires as illustrated by a bonding wire 26 connecting bar 14 to lead 34. Similarly, bars 12 and 15 could be connected to leads 34 via bonding wires, or leads 34 could abut bar 14 to provide additional connection to leads 34. In the preferred embodiment, bonding wires connect bars 13 and 14 to leads 19 and 34 respectively because such connections facilitate utilizing various configurations of die 20. Also, in this preferred embodiment, the configuration of leads 34 is employed since the configuration of leads 19 provides a moisture path into package 9 thereby reducing the useful lifetime of package 9. Since bars 12, 13, 14, and 15 are all connected together via flag 11, wires 21 and 24 connect pads 39 and 41, respectively, to leads 19 and 34, respectively.

By using bar 13 as an intermediate connection node, the length of wires 31 and 23 is short thereby lowering the inductance between pads 37 and 38, and leads 19. The width of bars 12, 13, 14, and 15 facilitates paralleling several bonding wires for each connection, as shown by parallel wires 23 and 31. These parallel bonding wires further reduce the inductance from leads 19 to pads 37 and 38.

In a preferred embodiment, it is believed important for each of bars 12, 13, 14, and 15 to be mechanically isolated from the other bars at the corners of flag 11. It has been found that completely enclosing the periphery of flag 11 with one continuous strip causes distortion and warping of such a strip thereby destroying the package that utilizes such a lead frame. As illustrated in FIG. 1, the ends of each of bars 12, 13, 14, and 15 are mechanically separated from the ends of adjacent bars by a distance 32. It is believed that distance 32 prevents warping and distortion thereby improving the reliability of package 9. In the preferred embodiment, space 32 is approximately 0.3 to 0.4 millimeters.

By facilitating connections to die 20, bars 12, 13, 14, and 15 allow lead frame 10 to accommodate a variety of different types and configurations of semiconductor die. Consequently, lead frame 10 is not dedicated to one particular semiconductor die layout or design, but can accommodate a variety of different layouts and designs. Such flexibility allows the cost of tooling lead frame 10 to be amortized over a large number of semiconductor designs thereby lowering the cost of the resulting semiconductor package. Also, bars 12, 13, 14, and 15 reduce the length of wire bonds thereby reducing inductance associated with the connections. If either of leads 19 or 34 are at ground potential, bars 12, 13, 14, and 15 form a ground plane that provides a low inductance ground connection to die 20 thereby improving the performance of die 20. Connecting all bonding pads of die 20 that are ground connections to bars 12, 13, 14, and 15 forms flag 11, supports 17, and bars 12, 13, 14, and 15 into a virtual ground. Forming the virtual ground near die 20 reduces inductance in the ground connections to die 20 thereby improving the high frequency stability and gain of die 20.

For example, a package formed from a standard lead frame having eight leads has approximately 1.25 nano-henries of inductance from each lead in a position similar to lead 19, to each pad in a position similar to pads 38. However, a package utilizing lead frame 10 has approximately 0.35 nano-henries of inductance from leads 19 to pads 38.

Additionally, lead frame 10 can be assembled in a standard assembly area using standard assembly techniques. Special tooling is not required thereby lowering the assembly cost of package 9. Additionally, bars 12, 13, 14, and 15 can be used for a variety of package types including, but not limited to, dual in line packages (both plastic and ceramic), and packages having leads on four sides.

Figure 2:
FIG. 2 illustrates an enlarged cross-sectional portion of a lead frame in accordance with the present invention.
Figure 2:
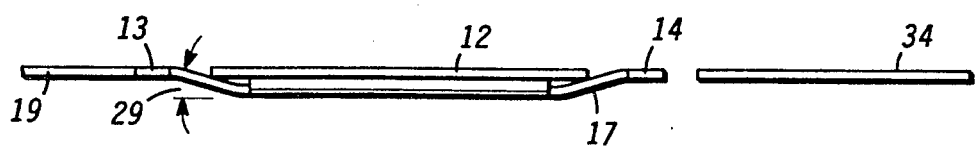

FIG. 2 illustrates an elevation view of lead frame 10, shown in FIG. 1, without die 20 and corresponding wire bonds. Portions of FIG. 2 that are the same as FIG. 1 have the same reference numerals. FIG. 2 illustrates that flag 11 is parallel to, but displaced from, the plane that includes both leads 19, 33, and 34, and bars 12, 13, 14, and 15. FIG. 2 also illustrates that supports 17 extend upward from the sides of flag 11 at an angle 29 in order to support bars 12, 13, 14, and 15. Angle 29 is determined by mechanical constraints limiting the bend radius of the material used for lead frame 10. Consequently, angle 29 is a constraining parameter and determines the distance between flag 11 and bars 12, 13, 14, and 15. In the preferred embodiment, the material used for lead frame 10 is copper, and angle 29 is not greater than approximately forty-five degrees.

By now it should be appreciated that there has been provided a novel lead frame for use in forming a novel low inductance semiconductor package. The lead frame's intermediate connection bars provide intermediate connection areas between the package's leads and a semiconductor die. The intermediate connection bars also facilitate lowering the inductance of the package's leads thereby improving the semiconductor device's performance. Mechanically isolating each intermediate connection bar from other intermediate conduction bars prevents distortion and warping the package thereby improving the package's reliability. Also, the intermediate connection bars facilitate utilizing the lead frame for a variety of semiconductor die layouts and configurations thereby lowering the semiconductor package's cost.

We claim:

1. A low inductance lead frame for a semiconductor package comprising:
   a substantially rectangular flag having sides;
   a plurality of substantially planar intermediate connection bars wherein the intermediate connection bars are substantially parallel to the sides of the flag and are in a plane that is both substantially parallel to a plane of the flag and displaced perpendicularly from the plane of the flag, and wherein ends of each intermediate connection bar are separated from ends of other intermediate connection bars of the plurality of substantially planar connection bars;
   a support extending from each side of the flag to each intermediate connection bar; and
   a plurality of leads substantially coplanar with each intermediate connection bar wherein at least one lead of the plurality of leads is connected to at least one intermediate connection bar by a bonding wire.

2. The low inductance lead frame of claim 1 further including a semiconductor die on the flag.

3. The low inductance lead frame of claim 2 further including a package body encasing the flag, the plurality of substantially planar intermediate connection bars, and a portion of the plurality of leads.

4. The low inductance lead frame of claim 1 wherein ends of each intermediate connection bar are separated from ends of other intermediate connection bars of the plurality of substantially planar intermediate connection bars by approximately 0.3 to 0.4 millimeters.

5. The low inductance lead frame of claim 1 wherein each intermediate connection bar of the plurality of substantially planar connection bars is approximately 0.2 to 0.5 millimeters wide.

6. A semiconductor package having a low inductance lead frame comprising:
   a die attach area having sides;
   a plurality of intermediate connection bars substantially parallel to the sides of the die attach area;
   a plurality of supports extending from the die attach area to the plurality of intermediate connection bars to support the plurality of intermediate connection bars; and
   a plurality of leads positioned in a plane and having proximal ends near the plurality of intermediate connection bars and physically isolated from the plurality of intermediate connection bars.

7. The semiconductor package of claim 6 further including the plurality of intermediate connection bars positioned in a plane that is substantially parallel to but displaced perpendicularly from a plane of the die attach area.

8. The semiconductor package of claim 6 wherein the plurality of intermediate connection bars substantially parallel to the sides of the die attach area includes each intermediate connection bar having ends that are separated from ends of other intermediate connection bars of the plurality of intermediate connection bars.

9. A semiconductor package having a low inductance lead frame comprising:
   a die attach area having sides;
   a plurality of intermediate connection bars substantially parallel to the sides of the die attach area, each intermediate connection bar having ends that are separated from ends of other intermediate connection bars of the plurality of intermediate connection bars by approximately 0.3 to 0.4 millimeters;
   a plurality of supports extending from the die attach area to the plurality of intermediate connection bars to support the plurality of intermediate connection bars; and
   a plurality of leads positioned in a plane and having proximal ends near the plurality of intermediate connection bars and electrically isolated from the plurality of intermediate connection bars.

10. The semiconductor package of claim 9 wherein each intermediate connection bar has a width of approximately 0.2 to 0.5 millimeters.

11. The semiconductor package of claim 9 wherein each support of the plurality of supports extends at an angle not greater than approximately 45 degrees from the die attach area to the plurality of intermediate connection bars.

12. A semiconductor package having a low inductance lead frame comprising:
   a die attach area having sides;
   a plurality of intermediate connection bars substantially parallel to the sides of the die attach area;
   a plurality of supports extending from the die attach area to the plurality of intermediate connection bars to support the plurality of intermediate connection bars;
   a plurality of leads positioned in a plane and having proximal ends near the plurality of intermediate connection bars and electrically isolated from the plurality of intermediate connection bars; and
   a bonding wire connecting an intermediate connection bar of the plurality of intermediate connection bars to a semiconductor die that is on the die attach area.

* * * * *